United States Patent
Van Dan Elzen et al.

(10) Patent No.: US 10,389,016 B2
(45) Date of Patent: Aug. 20, 2019

(54) VEHICLE COMMUNICATION SYSTEM WITH HEATED ANTENNA

(71) Applicant: MAGNA ELECTRONICS INC., Auburn Hills, MI (US)

(72) Inventors: Christopher L. Van Dan Elzen, Rochester, MI (US); Hasib Hassan, Belleville, MI (US)

(73) Assignee: MAGNA ELECTRONICS INC., Auburn Hills, MI (US)

( * ) Notice: Subject to any disclaimer, the term of this patent is extended or adjusted under 35 U.S.C. 154(b) by 212 days.

(21) Appl. No.: 15/421,484

(22) Filed: Feb. 1, 2017

(65) Prior Publication Data

US 2017/0141461 A1 May 18, 2017

Related U.S. Application Data

(63) Continuation-in-part of application No. 14/705,077, filed on May 6, 2015, now abandoned.

(Continued)

(51) Int. Cl.
| | |
|---|---|
| *B60R 1/00* | (2006.01) |
| *B60S 1/56* | (2006.01) |
| *H01Q 1/02* | (2006.01) |
| *H01Q 1/22* | (2006.01) |
| *H01Q 1/32* | (2006.01) |
| *H01Q 1/42* | (2006.01) |
| *H05B 3/14* | (2006.01) |

(Continued)

(52) U.S. Cl.
CPC ............... *H01Q 1/325* (2013.01); *B60R 1/00* (2013.01); *B60R 11/04* (2013.01); *B60S 1/56* (2013.01); *G02B 13/0015* (2013.01); *G08C 17/02* (2013.01); *H01Q 1/02* (2013.01); *H01Q 1/2291* (2013.01); *H01Q 1/42* (2013.01); *H04N 5/2254* (2013.01); *H05B 3/145* (2013.01); *H05B 3/84* (2013.01); *H05K 1/09* (2013.01); *B60R 2300/10* (2013.01); *H05B 2203/013* (2013.01)

(58) Field of Classification Search
CPC ....... B60R 11/04; B60R 1/00; B60R 2300/10; B60S 1/56; G02B 13/0015; G08C 17/02; H01Q 1/02; H01Q 1/2291; H01Q 1/325; H01Q 1/42; H04N 5/2254; H05B 2203/013; H05B 3/145; H05B 3/84; H05K 1/09
See application file for complete search history.

(56) References Cited

U.S. PATENT DOCUMENTS

| | | | |
|---|---|---|---|
| 5,557,289 A | * | 9/1996 | Ohara .................. H01Q 1/1271 343/704 |
| 6,087,953 A | | 7/2000 | DeLine et al. |

(Continued)

*Primary Examiner* — Lewis G West
(74) *Attorney, Agent, or Firm* — Honigman LLP

(57) ABSTRACT

A communication system for a vehicle includes a control operable to communicate with a device remote from the vehicle, and an antenna disposed at an exterior portion of the vehicle. The control at least one of (i) wirelessly transmits signals via the antenna to a remote receiver and (ii) receives signals via the antenna wirelessly transmitted by a remote transmitter. A heater element is disposed at or near the antenna. The heater element is electrically connected to a power source of the vehicle and is energizable by the power source to generate heat to melt snow or ice at or near the antenna. The heater element may include a graphene trace disposed at a panel or housing at or near the antenna.

20 Claims, 2 Drawing Sheets

Related U.S. Application Data

(60) Provisional application No. 62/290,579, filed on Feb. 3, 2016, provisional application No. 61/991,809, filed on May 12, 2014.

(51) Int. Cl.
| | | |
|---|---|---|
| *H05B 3/84* | (2006.01) | |
| *H05K 1/09* | (2006.01) | |
| *B60R 11/04* | (2006.01) | |
| *G02B 13/00* | (2006.01) | |
| *G08C 17/02* | (2006.01) | |
| *H04N 5/225* | (2006.01) | |

(56) References Cited

U.S. PATENT DOCUMENTS

| | | | |
|---|---|---|---|
| 7,289,037 B2 | 10/2007 | Uken et al. | |
| 7,400,435 B2 | 7/2008 | Byers et al. | |
| 7,480,149 B2 | 1/2009 | DeWard et al. | |
| 8,256,821 B2 | 9/2012 | Lawlor et al. | |
| 9,487,159 B2 | 11/2016 | Achenbach | |
| 9,596,387 B2 | 3/2017 | Achenbach et al. | |
| 2005/0251297 A1* | 11/2005 | Dery | F02N 11/0807 701/2 |
| 2007/0109207 A1* | 5/2007 | Mondadori | H01Q 1/1278 343/713 |
| 2009/0051510 A1* | 2/2009 | Follmer | G07C 5/008 340/425.5 |
| 2009/0295181 A1 | 12/2009 | Lawlor et al. | |
| 2011/0030772 A1* | 2/2011 | Veerasamy | B82Y 30/00 136/256 |
| 2011/0297661 A1 | 12/2011 | Raghavan et al. | |
| 2012/0062743 A1 | 3/2012 | Lynam et al. | |
| 2012/0117745 A1* | 5/2012 | Hattori | B60S 1/0848 15/250.01 |
| 2012/0190386 A1* | 7/2012 | Anderson | G01C 15/04 455/456.3 |
| 2012/0229882 A1 | 9/2012 | Fish, Jr. et al. | |
| 2012/0243093 A1 | 9/2012 | Tonar et al. | |
| 2013/0222592 A1 | 8/2013 | Gieseke | |
| 2013/0298399 A1* | 11/2013 | Trigwell | H01L 31/02246 29/846 |
| 2014/0124495 A1* | 5/2014 | Feng | H05B 3/86 219/203 |
| 2014/0218529 A1 | 8/2014 | Mahmoud et al. | |
| 2014/0226012 A1 | 8/2014 | Achenbach | |
| 2014/0375476 A1 | 12/2014 | Johnson et al. | |
| 2015/0124096 A1 | 5/2015 | Koravadi | |
| 2015/0142263 A1* | 5/2015 | Hirai | B60S 1/0844 701/36 |
| 2015/0158499 A1 | 6/2015 | Koravadi | |
| 2015/0251599 A1 | 9/2015 | Koravadi | |
| 2015/0312967 A1* | 10/2015 | Qian | H05B 3/84 219/203 |
| 2015/0321621 A1 | 11/2015 | Van Dan Elzen et al. | |
| 2015/0327398 A1 | 11/2015 | Achenbach et al. | |
| 2015/0352953 A1 | 12/2015 | Koravadi | |
| 2016/0036917 A1 | 2/2016 | Koravadi et al. | |
| 2016/0210853 A1 | 7/2016 | Koravadi | |
| 2016/0381571 A1 | 12/2016 | Koravadi et al. | |

\* cited by examiner

VEHICLE COMMUNICATION SYSTEM WITH HEATED ANTENNA

CROSS REFERENCE TO RELATED APPLICATIONS

The present application claims the filing benefits of U.S. provisional application Ser. No. 62/290,579, filed Feb. 3, 2016, which is hereby incorporated herein by reference in its entirety. The present application is also a continuation-in-part of U.S. patent application Ser. No. 14/705,077, filed May 6, 2015, which claims the filing benefits of U.S. provisional application Ser. No. 61/991,809, filed May 12, 2014, which are hereby incorporated herein by reference in their entireties.

FIELD OF THE INVENTION

The present invention relates generally to a vehicle communication system for a vehicle and, more particularly, to a vehicle communication system that utilizes one or more antennae at a vehicle.

BACKGROUND OF THE INVENTION

Communication systems for vehicles may provide for communication between vehicles and/or between a vehicle and a remote server. Examples of such systems are described in U.S. Pat. No. 7,580,795, which is hereby incorporated herein by reference in its entirety. Communication systems for vehicles may provide for communication between vehicles and/or between a vehicle and a remote server. Recently developed Dedicated Short Range Communication (DSRC) radio technology enables communications-based active safety systems. Communication links for such applications need to be reliable, high speed, low latency links that are immune to extreme weather conditions and that work reliably in high speed mobility conditions and multipath roadway environments.

SUMMARY OF THE INVENTION

The present invention provides a communication system for a vehicle that utilizes an antenna disposed at an exterior of the vehicle for transmitting or receiving signals for communicating with another vehicle or remote server. The antenna is disposed at an outer panel of the vehicle, such as a roof panel or glass roof or rear window of the vehicle (or other outer vehicle surface), and the antenna housing and/or the panel at which the antenna is disposed has/have a heating element incorporated thereat so as to provide a heater function at or near the antenna. Such a heater function can be actuated to melt snow and/or ice around the antenna to provide for enhanced communication ranges in snow/ice conditions.

The heating element may comprise any suitable heating element, such as, for example, a graphene material or other material coated at or disposed at the panel or antenna housing that may be electrically energizable or powered to provide a heating function at or near or around the antenna.

These and other objects, advantages, purposes and features of the present invention will become apparent upon review of the following specification in conjunction with the drawings.

DESCRIPTION OF THE PREFERRED EMBODIMENTS

Figure 1:
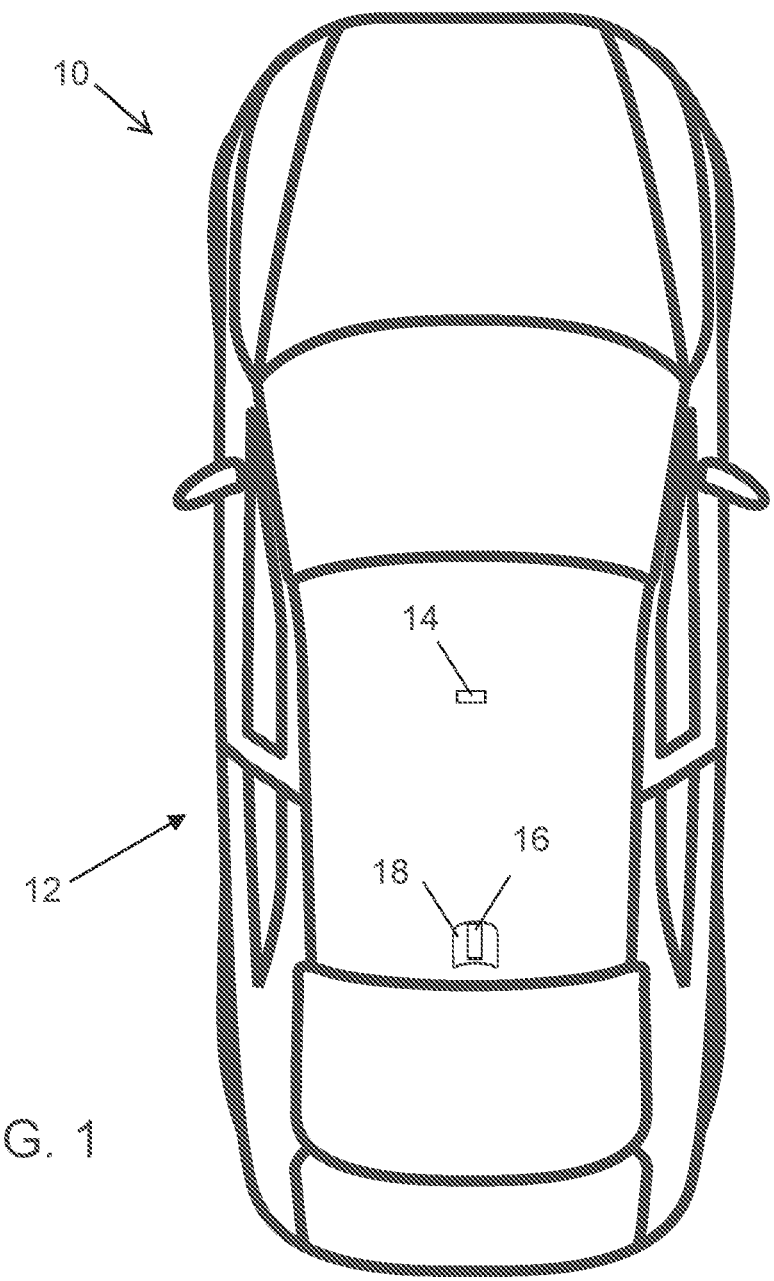
FIG. 1 is a plan view of a vehicle with a vision system that incorporates a communication system and heating element in accordance with the present invention.

A vehicle communication system and/or driver assist system and/or alert system operates to communicate with other vehicles (such as a V2V communication system or the like) or with a remote server or infrastructure (such as a telematics system and/or a vehicle-to-infrastructure or V2I system or the like). The communication system includes a control that is operable to communicate with other vehicles or infrastructure via use of an antenna disposed at an exterior portion or surface of the vehicle.

Such vehicle communication systems may provide for communication between vehicles and/or between a vehicle and a remote server. Such car2car or vehicle-to-vehicle (V2V) and vehicle-to-infrastructure (car2X or V2X or V2I or 4G or 5G) technology provides for communication between vehicles and/or infrastructure based on information provided by one or more vehicles and/or information provided by a remote server or the like. The vehicle communication systems may utilize aspects of the systems described in U.S. Pat. Nos. 6,690,268; 6,693,517 and/or 7,580,795, and/or U.S. Publication Nos. US-2014-0375476; US-2014-0218529; US-2013-0222592; US-2015-0251599; US-2016-0036917; US-2016-0210853; US-2012-0218412, US-2012-0062743, US-2015-0158499 US-2015-0124096 and/or US-2015-0352953, which are all hereby incorporated herein by reference in their entireties.

The range of the communication link (with the infrastructure or remote server or other vehicle) may be degraded as the snow or rain water density increases. For safety critical applications it is very important to have good range during such bad weather conditions. The range may be improved if the system is aware of such situations and the transmission power of the radio is dynamically controlled during such situations, such as by utilizing aspects of the systems described in U.S. Publication No. US-2016-0381571, which is hereby incorporated herein by reference in its entirety. The present invention provides for localized heating at and around the antenna to melt any snow or ice that may accumulate in cold weather conditions, with the localized heating optionally utilizing aspects of the heating elements described in U.S. Pat. No. 7,400,435 and/or U.S. Publication No. US-2015-0321621, which are hereby incorporated herein by reference in their entireties.

Referring now to the drawings and the illustrative embodiments depicted therein, a vehicle 10 includes a communication system 12 that includes a control or electronic control unit (ECU) or processor 14 that is operable to process signals received from other vehicles or the like, such as for a V2V system, and to generate signals for transmission to other vehicles or the like. The control 14 is connected to or in communication with an antenna 16 disposed at an exterior surface or panel of the vehicle. The data transfer or signal communication from the antenna to the ECU may comprise any suitable data or communication link, such as a vehicle network bus or the like of the equipped vehicle. The antenna housing and/or the exterior surface or panel of the vehicle at or near where the antenna is disposed includes a heating element 18 (such as a resistive coating or the like that is electrically powered to heat the area at or near or around the antenna).

The heating film or element or shield of the present invention may be applied to at least one antenna (or at or around multiple antenna), such as at an antenna housing that is at an exterior portion of the vehicle where the antenna may be exposed to the exterior elements. The heating film or element or shield may comprise any suitable heating element, such as a graphene material. Graphene is an allotrope of carbon in the form of a two-dimensional, atomic-scale, hexagonal lattice in which one atom forms each vertex. Graphene is a zero-gap semiconductor, is electrically conductive and is highly thermally conductive.

For example, the heating element 18 at the outer surface of the vehicle panel and/or antenna housing may comprise a graphene material so as to be a substantially strong element. The heatable housing or panel may comprise any suitable material, such as glass or plastic. Optionally, the vehicle panel and/or antenna housing may have an outer surface (which may be exposed to the elements) with an electrically conductive graphene heating trace or structure or thin film coating 20 (FIG. 2) disposed at or established at the outer surface that, when a voltage is applied and electrical current is passed through the graphene heating trace or structure or coating, the vehicle panel and/or antenna housing is heated. The graphene heating trace may be electrically connected at contacts or contacting structure 21 that are operable to power the graphene heating trace to heat the vehicle panel and/or antenna housing (or optionally a protective film or transparent shielding at the vehicle panel and/or antenna housing), such as to melt ice or snow at the vehicle panel and/or antenna housing (or film or shielding) or to defog or defrost the vehicle panel and/or antenna housing (or film or shielding).

Figure 2:
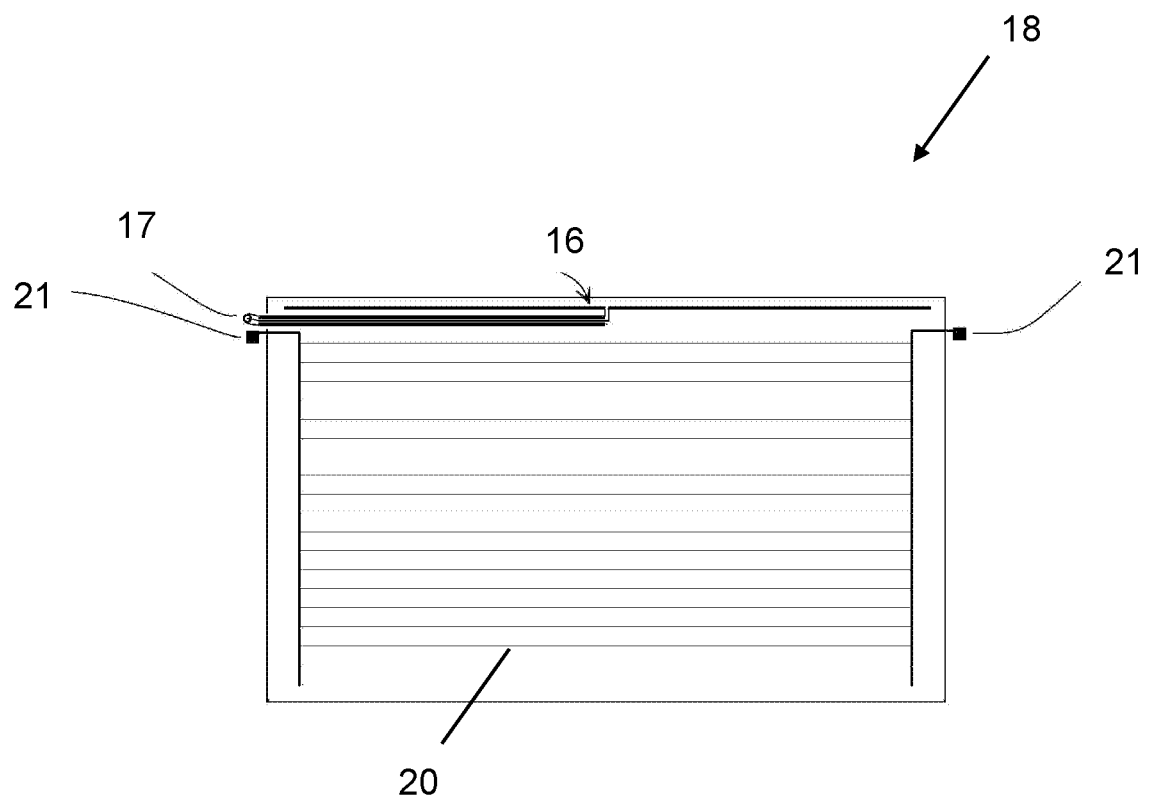
FIG. 2 is a perspective view of the vehicle panel portion, showing the heater element circuit and electric leads.

The heating device or element is operable to heat the area or region at which the antenna 16 is disposed. As shown in FIG. 2, the antenna 16 may comprise a di pole antenna that is connected to the communication system and/or processor 14 via a coaxial connector 17 or the like.

The heating element 18 may be actuated responsive to a user input or responsive to detection of snow or ice at or near the antenna 16. For example, when a user first starts the vehicle ignition on a cold day, the system may automatically activate the heating element and/or the user may selectively activate the heating element via a user input. Optionally, the heating element may automatically activate when needed, such as responsive to image processing of image data captured by an exterior viewing camera, where such image processing detects snow or ice present at or on or around the vehicle.

Thus, a surface of a vehicle panel and/or antenna housing (or other element, such as a window or the like at which an antenna is disposed) or a protective film or element (such as a tempered glass film or sheet or layer or a polymer film or sheet or layer) may have a graphene trace to provide a heating function. The protective film or layer or element may have embedded electric leads and a graphene trace, and may be applied easily and replaced if damaged. Such a protective film may be used in any suitable application, and may mate with various vehicle substrates or glass substrates (such as any or all windows or a glass roof of a vehicle) or mirror substrates (such as for any or all exterior mirrors of a vehicle) or optics (such as for imaging sensors or cameras of a vision system of a vehicle) that are manufactured or assembled with opposing electric leads.

Graphene is a relatively new material that has unique characteristics that allow for many uses. Graphene is a two dimensional allotrope of carbon that has excellent electrical conductivity. The structure of the Graphene makes it near transparent. Because of its ability to be transparent or transmissive of light, graphene may be suitable for use as a coating or trace at a surface of a glass or plastic element or panel or housing.

Optionally, the vehicle panel at or around the antenna or the antenna housing itself may be made from graphene, to provide enhanced strength of the panel or housing so that the panel or housing may withstand impact and contact with rocks, salt, dirt and/or the like, at the exterior environment.

Optionally, the graphene material may be used at or on a glass or plastic window of a vehicle or at or on a replaceable protective film or element disposed at a window of a vehicle. For example, a graphene coating may be applied at a vehicle windshield for defrosting of the glass windshield, or a replaceable protective film or element having a graphene trace or coating may be affixed on the windshield, such as at or near a forward facing camera or imager (such as a camera of the types described in International Publication Nos. WO 2013/123161 and/or WO 2013/019795, and/or U.S. Pat. Nos. 8,256,821; 7,480,149; 7,289,037; 7,004,593; 6,824,281; 6,690,268; 6,445,287; 6,428,172; 6,420,975; 6,326,613; 6,278,377; 6,243,003; 6,250,148; 6,172,613 and/or 6,087,953, and/or U.S. Publication Nos. US-2009-0295181; US-2014-0226012 and/or US-2015-0327398, which are all hereby incorporated herein by reference in their entireties) or the like. Optionally, the graphene material may be layered into the auto glass or mirrors or replaceable protective films or elements to facilitate its defrosting.

The passing of an electrical current through a layered network of graphene at or near the outer surface of a vehicular glass window, windshield, mirror, or replaceable protective film or element may provide for a rapid defrosting of the vehicle window, windshield, mirror, or replaceable protective film or element. The use of such a heatable graphene coating may limit or prevent the build-up of ice on the vehicle panels and/or windows and/or mirrors while the driver is driving the vehicle.

Thus, the present invention provides for use of graphene material or other heatable material or element or conductive trace at or on or near a vehicle panel and/or antenna housing, such as for heating the antenna housing or vehicle panel at or near the antenna that is at least partially exposed to the environment at an exterior region of the vehicle. The graphene provides enhanced strength to the optic and/or provides a heating element to melt snow/ice or defrost the vehicle panel and/or antenna housing. Optionally, the graphene may be applicable at or in a glass window or mirror reflective element of a vehicle or a replaceable protective film or element affixed to a glass window or mirror reflective element, such as at or in or on at least a portion of a windshield or mirror reflective element of the vehicle, to provide enhanced defogging or defrosting of the windshield or mirror portion when the graphene coating or element or portion is energized.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A communication system for a vehicle, said communication system comprising:

a control operable to wirelessly communicate with a device remote from the vehicle;

an antenna disposed at an exterior portion of the vehicle;

a housing disposed at the exterior portion of the vehicle, wherein said antenna is accommodated within said housing;

wherein said control at least one selected from the group consisting of (i) wirelessly transmits signals via said antenna to a remote receiver and (ii) receives signals via said antenna wirelessly transmitted by a remote transmitter;

a heater element disposed at said housing; and wherein said heater element is electrically connected to a power source of the vehicle and is energizable by the power source to generate heat to melt snow or ice at said housing that accommodates said antenna.

2. The communication system of claim 1, wherein said housing protrudes at a panel of the vehicle.

3. The communication system of claim 2, wherein the panel of the vehicle comprises a roof panel of the vehicle.

4. The communication system of claim 1, wherein said housing comprises a plastic material.

5. The communication system of claim 1, wherein said housing comprises a glass material.

6. The communication system of claim 1, wherein said heater element comprises a graphene trace.

7. The communication system of claim 1, wherein said control wirelessly transmits signals via said antenna to a remote receiver.

8. The communication system of claim 1, wherein said control receives signals via said antenna wirelessly transmitted by a remote transmitter.

9. The communication system of claim 1, wherein said heater element is actuated via a user input.

10. The communication system of claim 1, wherein said heater element is actuated responsive to a detection of snow or ice at or near said housing.

11. The communication system of claim 1, wherein said heater element is actuated responsive to a determined ambient temperature.

12. A communication system for a vehicle, said communication system comprising:

a control operable to wirelessly communicate with a device remote from the vehicle;

an antenna disposed at an exterior portion of the vehicle;

a housing disposed at the exterior portion of the vehicle, wherein said antenna is accommodated within said housing;

wherein said control (i) wirelessly transmits signals via said antenna to a remote receiver and (ii) receives signals via said antenna wirelessly transmitted by a remote transmitter;

a heater element disposed at said housing;

wherein said heater element comprises a graphene trace;

wherein said heater element is electrically connected to a power source of the vehicle and is energizable by the power source to generate heat to melt snow or ice at said housing that accommodates said antenna; and wherein said heater element is actuated responsive to a detection of snow or ice at said housing.

13. The communication system of claim 12, wherein said housing protrudes at a panel of the vehicle.

14. The communication system of claim 13, wherein the panel of the vehicle comprises a roof panel of the vehicle.

15. The communication system of claim 12, wherein said housing comprises a plastic material.

16. The communication system of claim 12, wherein said housing comprises a glass material.

17. A communication system for a vehicle, said communication system comprising:

a control operable to wirelessly communicate with a device remote from the vehicle;

an antenna disposed at an exterior portion of the vehicle;

a housing disposed at the exterior portion of the vehicle, wherein said antenna is accommodated within said housing;

wherein said control (i) wirelessly transmits signals via said antenna to a remote receiver and (ii) receives signals via said antenna wirelessly transmitted by a remote transmitter;

a heater element disposed at said housing;

wherein said heater element comprises a graphene trace;

wherein said heater element is electrically connected to a power source of the vehicle and is energizable by the power source to generate heat to melt snow or ice at said housing that accommodates said antenna; and wherein said heater element is actuated responsive to a determined ambient temperature.

18. The communication system of claim 17, wherein said housing protrudes at a panel of the vehicle.

19. The communication system of claim 18, wherein the panel of the vehicle comprises a roof of the vehicle.

20. The communication system of claim 17, wherein said housing comprises a plastic material.

* * * * *